United States Patent
Kobayashi et al.

[11] Patent Number: 5,862,515
[45] Date of Patent: Jan. 19, 1999

[54] BATTERY TESTER

[75] Inventors: Kenji Kobayashi; Mitsuyoshi Tanaka; Hideki Tomiyama; Atsushi Mizuno; Kazuhiro Seki; Takayuki Terashima, all of Ueda, Japan

[73] Assignee: Hioki Denki Kabushiki Kaisha, Ueda, Japan

[21] Appl. No.: 801,579

[22] Filed: Feb. 14, 1997

[30] Foreign Application Priority Data

Feb. 16, 1996 [JP] Japan .................................. 8-053975
Mar. 4, 1996 [JP] Japan .................................. 8-073160

[51] Int. Cl.$^6$ .......................... G01N 27/04; G01N 27/27
[52] U.S. Cl. ........................ 702/63; 702/64; 702/65; 702/82; 702/133; 324/432; 324/430; 324/428; 324/437; 324/433; 324/431; 324/73.1; 340/636
[58] Field of Search .................................. 324/73.1, 432, 324/428, 430, 426, 431, 427, 433, 437; 364/481, 482; 702/483, 550, 63–65, 82, 133, 116

[56] References Cited

U.S. PATENT DOCUMENTS

| | | | |
|---|---|---|---|
| 4,423,378 | 12/1983 | Marino et al. ........................... | 324/427 |
| 4,719,428 | 1/1988 | Liebermann ............................. | 324/436 |
| 5,592,093 | 1/1997 | Klingbiel .................................. | 324/426 |

*Primary Examiner*—James P. Trammell
*Assistant Examiner*—Tuan Q. Dam
*Attorney, Agent, or Firm*—Kanesaka & Takeuchi

[57] ABSTRACT

A battery tester is formed at an AC constant-current generator for applying an AC current for measurement to a battery BT under test via a coupling capacitor, an internal resistance detecting device for detecting the internal resistance of the battery BT according to a voltage signal therefrom when the AC current is applied, a voltage detecting device for detecting the terminal voltage across the battery, and a deterioration judging unit for judging the deterioration of the battery from the internal resistance and terminal voltage detected by the internal resistance detecting device and the voltage detecting device. The internal resistance and terminal voltage of the battery are measured simultaneously, and deterioration of the battery is judged from the measurement data.

16 Claims, 9 Drawing Sheets

FIG. 2

| | INTERNAL RESISTANCE DATA | TERMINAL VOLTAGE DATA | TEMPERATURE DATA | RESULT |
|---|---|---|---|---|
| AREA 1 | | | | |
| AREA 2 | | | | |
| AREA 3 | | | | |
| ⋮ | | | | |
| | | | | |
| | | | | |

FIG. 3

| RESISTANCE \ VOLTAGE | MORE THAN THRESHOLD $\gamma$ | THRESHOLD $\gamma$ | LESS THAN THRESHOLD $\gamma$ |
|---|---|---|---|
| LESS THAN THRESHOLD $\alpha$ | PASS | | WARNING |
| THRESHOLD $\alpha$ | | | |
| INTERMEDIATE BETWEEN THRESHOLD $\alpha$ AND THRESHOLD $\beta$ | WARNING [FLASHING] | | WARNING |
| THRESHOLD $\beta$ | | | |
| MORE THAN THRESHOLD $\beta$ | FAIL | | FAIL |

FIG. 4

| | | | | |
|---|---|---|---|---|
| PATTERN 1 | COMPARATOR VALUE | MAX VALUE<br>MIN VALUE | RANGE INFORMATION | 0: 300mΩ<br>1: 3Ω<br>2: 30Ω |
| PATTERN 2 | COMPARATOR VALUE | MAX VALUE<br>MIN VALUE | RANGE INFORMATION | 0: 300mΩ<br>1: 3Ω<br>2: 30Ω |
| PATTERN 3 | COMPARATOR VALUE | MAX VALUE<br>MIN VALUE | RANGE INFORMATION | 0: 300mΩ<br>1: 3Ω<br>2: 30Ω |

FIG. 7A  +INPUT TERMINAL VOLTAGE OF AMPLIFIER 111
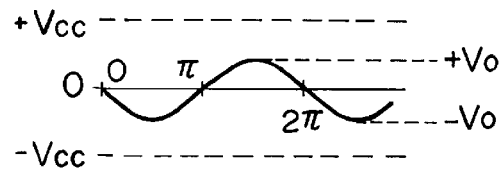
FIG. 7B  OUTPUT VOLTAGE OF AMPLIFIER 111 (BASE VOLTAGE OF TRANSISTOR Tr)
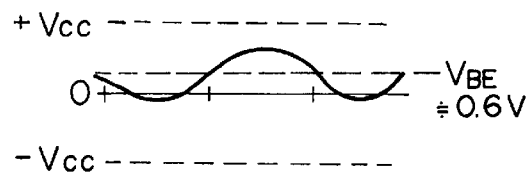
FIG. 7C  −INPUT TERMINAL VOLTAGE OF AMPLIFIER 111 (EMITTER VOLTAGE OF TRANSISTOR Tr)
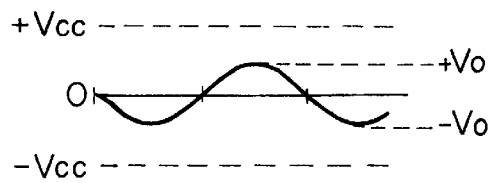
FIG. 7D  COLLECTOR VOLTAGE OF TRANSISTOR Tr
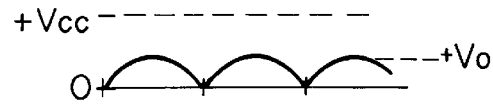
FIG. 7E  INPUT VOLTAGE OF COMPARATOR 112
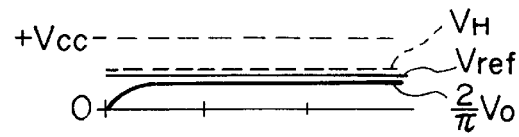
FIG. 7F  OUTPUT VOLTAGE OF COMPARATOR 112
FIG. 7G  OUTPUT VOLTAGE OF DIODE D
FIG. 7H  OUTPUT VOLTAGE OF INVERTER 113
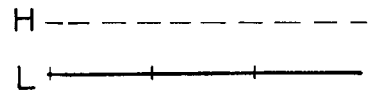

FIG. 9A  +INPUT TERMINAL VOLTAGE OF AMPLIFIER 111
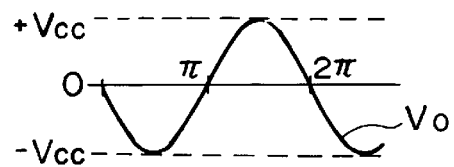
FIG. 9D  COLLECTOR VOLTAGE OF TRANSISTOR Tr
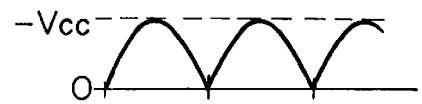
FIG. 9E  INPUT VOLTAGE OF COMPARATOR 112
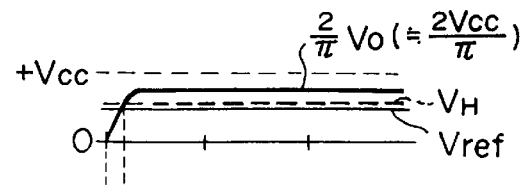
FIG. 9F  OUTPUT VOLTAGE OF COMPARATOR 112
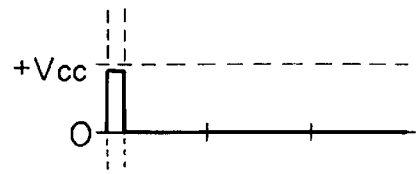
FIG. 9G  OUTPUT VOLTAGE OF DIODE D
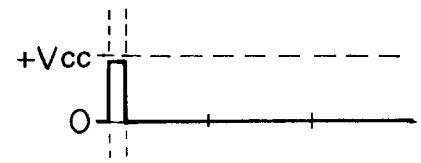
FIG. 9H  OUTPUT VOLTAGE OF INVERTER 113
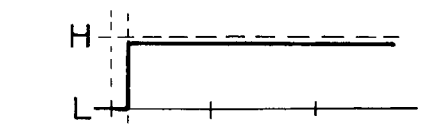

BATTERY TESTER

BACKGROUND OF THE INVENTION

1. Field of the Invention

This invention relates to battery testers and, more particularly, to battery testers which can determine the deteriorated state of a battery from simultaneous measurements of the internal resistance, terminal voltage, etc. of the battery.

2. Description of the Prior Art

The deteriorated state of a battery (either primary or secondary battery) is usually determined from the internal resistance (or equivalent series resistance) and terminal voltage of the battery. Battery deterioration tends to result in internal resistance increase and terminal voltage reduction of the battery.

Heretofore, the deteriorated state of a battery is determined by using an AC resistance gauge (for instance AC m Ω gauge) and a tester (or circuit tester). The internal resistance of the battery is measured with the AC resistance gauge, and the terminal voltage is measured with the tester. According to these measurements the deteriorated state of the battery can be determined. The internal resistance of the battery is temperature-dependent, and when more accurate judgment is required, the ambient temperature around a part of the battery under measurement is measured with a temperature gauge, and taken into consideration as reference data for the battery deterioration judgment.

This battery deterioration judgment, however, requires two measuring instruments, i.e., the AC resistance gauge and the tester. In addition, the internal resistance and the terminal voltage have to be measured separately, and these measuring operations are inevitably cumbersome. Moreover, in the case of taking the ambient temperature into consideration AS reference data, the temperature measurement with a temperature gauge is necessary and increases the operational burden.

Further cumbersomeness is added to the battery deterioration judgment on the bases of the above measurements by different criteria of judgment with different battery manufacturers and models. In other words, whenever battery deterioration judgment is made, it is necessary to make cumbersome checks of battery characteristics from battery specifications or the like.

As an example, a case of measuring the internal resistance of a vehicle-mounted battery will now be described. As shown in FIG. 10, a pair of source side probes 1a and 1b led out from an AC constant-current generator 1, and a pair of sense side probes 2a and 2b from an AC volt meter 2, are held in contact with the plus and minus terminals, respectively, of a battery BT. An AC current for measurement is caused from the AC current generator 1, and the terminal voltage generated across the battery BT is measured with the AC volt meter 2. The measurement is converted in a next stage A/D converter into digital data, which is in turn converted in a CPU 4 into a corresponding resistance.

When the internal resistance Rs of the battery is increased due to deterioration thereof or like cause, the terminal voltage generated across the battery is correspondingly increased. When a rating value of measurement is exceeded, overflow of the A/D converter 3 takes place.

In the principle underlying the above measurement, the source side pair probes 1a and 1b and sense side pair probes 2a and 2b, i.e., a total of four probes, are electrically connected to the plus and minus terminals of the battery BT. However, independently connecting the probes to the terminals is time-consuming. Actually, therefore, one source side probe 1a and one sense side probe 2a are commonly connected to a positive side clamp probe of a clip type, while commonly connecting the other source side probe 1b and the other sense side probe 2b to a negative side clamp probe of like type, and then the two, i.e., positive and negative side clamp probes, are connected to the plus and minus terminals, respectively, of the battery BT.

Where the above clamp probes are used as two terminals, however, in the event of defective connection between the clamp probes and battery terminals or breaking due to detachment of the clamp probes from the battery terminals, the AC constant-current generator 1 is brought to a load-free state, and its output voltage is directly applied across the AC volt meter 2. Therefore, the overflow of the A/D converter 3 takes place due to the reason noted above.

A problem is therefore posed that it cannot be determined whether overflow of the A/D converter 3 is caused by battery internal resistance increase or by defective contact (or breaking) of the clamp probes with respect to the battery terminals.

In the case of directly using the four probes 1a, 1b, 2a and 2b as respective terminals as shown in FIG. 10, without replacing these probes with the two clamp probes, a resistor with a high resistance is sometimes connected between the probes 1a and 2a to prevent the open circuit therebetween. Again in such a case, defective contact regarded to be a breaking between these probes and the battery terminals would result in overflow of the A/D converter 3.

SUMMARY OF THE INVENTION

The invention has been made in order to solve the above problems inherent in the prior art, and a first object of the invention is to provide a battery tester, which permits simultaneous measurements of the internal resistance and terminal voltage of a battery in a single operation, and can automatically determine battery deterioration on the basis of these measurements.

A second object of the invention is to provide a battery tester, in which whether a high terminal voltage across a battery such as to result in overflow of an A/D converter on the measuring unit (sense) side, as detected when an AC constant current is appplied to the battery for measuring the internal resistance thereof, is due to internal resistance increase or due to defective contact (breaking) between battery terminals and probes, can be automatically judged.

To attain the first object of the invention, a first feature of the battery tester according to the invention resides in that it comprises an AC constant-current generator for applying an AC current for measurement to a battery under test via a coupling capacitor, an internal resistance detecting means for detecting the internal resistance of the battery according to an AC voltage signal generated from the battery when the AC current is applied thereto, a voltage detecting means for detecting the DC terminal voltage across the battery, and a deterioration judging means for judging the deterioration of the battery from the internal resistance detected by the internal resistance detecting means and the DC terminal voltage detected by the voltage detecting means.

The internal resistance detecting means may include wave detection means connected between the terminals of the battery via the coupling capacitor, for detecting a voltage proportional to the internal resistance of the battery in synchronism to the phase of the AC current for meassurement.

The deterioration judging means may include an AC converter for converting the detection signals from the internal resistance detecting means and the voltage detecting means into digital data, a data memory for storing the digital data, a control memory, in which threshold resistance data and threshold voltage data for judging the deterioration of the battery are stored, and a control means (i.e., a central processing unit or a microcomputer) for writing the measured value of the internal resistance of the battery and the measured value of the DC terminal voltage in the data memory and judging the deterioration of the battery by comparing the measured internal resistance value with the threshold resistance data and comparing the measured DC terminal voltage with the threshold voltage data. The result of judgment in the deterioration judging means is displayed on a display or recorded with a printer.

Suitably, the internal resistance detecting means and the voltage detecting means are alternately switched by a switch, thereby providing the detection signals from the internal resistance detecting means and the voltage detecting means to the AC converter.

Denoting threshold values of the internal resistance by $\alpha$ and $\beta$ ($\alpha<\beta$), a threshold value of the thermal voltage by $\gamma$, the measured interval resistance value by R, and the measured terminal voltage value by V, the control means, a CPU, judges:

① "pass" when $R \leq \alpha$ and $V > \gamma$;

② "warning:" when $R \leq \alpha$ and $V \leq \gamma$, when $\alpha < R \leq \beta$ and $V > \gamma$ or when $\alpha < R \leq \beta$ and $V \leq \gamma$; and ③ "fail" when $R > \beta$ and $V > \gamma$, or when $R > \beta$ and $V \leq \gamma$, the result of judgment being displayed on the display.

When "warning" in (2) is judged, the case when $R \leq \alpha$ and $V \leq \gamma$ and the case when $\alpha < R \leq \beta$ and $V > \gamma$ or when $\alpha < R \leq \beta$ and $V \leq \gamma$ are displayed such that these cases are distinguishable from each other.

In the case when $R \leq \alpha$ and $V \leq \gamma$, short-circuit of a battery cell or overdischarge thereof is the conceivable cause. This case is thus made distinguishable from the case when $\alpha < R \leq \beta$ and $V > \gamma$ or the case when $\alpha < R \leq \beta$ and $V \leq \gamma$ by, for instance, displaying a work "WARNING" indicative of warning by flashing display.

The batter tester may further comprise an operating means for providing various instruction signals to the control means, range setting information with respect to analog measurement means including the internal resistance detecting means and the voltage detecting means being written for each threshold data in the control memory, a range of the analog measurement means being switched whenever the threshold data is updated by the operation means.

The threshold data thus can be easily updated, for instance in a keying operation in the operating means, according to the rating or kind of the battery under test. In addition, since the range of the analog measuring means is switched by the updating, the operation control of the measurement can be greatly improved.

A further feature of the invention resides in a temperature detecting means for directly detecting the temperature of a terminal of the battery. The temperature detecting means is selectively switchable together with the internal resistance detecting means and the voltage detecting means by a switch, whereby battery terminal temperature data from the temperature detecting means is stored in the data memory in relation to resistance and voltage data of the battery.

The battery tester further comprises a probe having a pair of openable and closable probe arms for clamping termnals of the battery, each of the arms having an end provided with a measuring electrode commonly used for the internal resistance detecting means and the voltage detecting means, the temperature detecting means being assembled in either one of the probe arms such as to be able to be in contact with a terminal of the battery.

The probe permits battery terminal temperature measurement simultaneously with the measurements of the internal resistance and terminal voltage of the battery. It is thus possible to omit a time-consuming separate temperature measurement by preparing a separate temperature gauge as in the prior art. In addition, since the the temperature detecting means is held in direct contact with the battery terminal, accurate temperature measurement thereof can be obtained.

Suitably, the temperature detecting means is mounted on the probe arm via an elastic member such as a rubber member. The temperature detecting means thus can be held in contact with the battery terminal over a broader area, so that more accurate terminal temperature measurement can be obtained.

Further suitably, the prove has a memory trigger switch for providing to the CPU an instruction for taking measurement data in the data memory. Thus, in the case of taking internal resistance data or the like by holding a probe in contact with each of a number of juxtaposed batteries as in an UPS (uninterruptible power supply), data may be taken in the memory by depressing the memory trigger switch by hand provided on the probe without separating the hand therefrom.

To attain the second object, a second feature of the battery tester according to the invention resides in a breaking detection circuit, which, when the internal resistance of the battery under test is measured by causing an AC current for measurement from an AC constant-current generator to the battery, detecting an AC voltage generated between the terminals of the battery on the side of the measuring means, and converting the detected AC voltage into a resistance value, compares the output voltage from the ac constant-current generator with a predetermined reference voltage, and checks whether the current path between the AC constant-current generator and the battery is open or closed based on whether the reference voltage is exceeded.

The AC constant-current generator amplifies an AC voltage at a constant level generated from an AC constant-voltage generator with an amplifier and sets an AC current for measurement through the battery to a predetermined level with a resistor provided in a current path leading from the output side of the amplifier to the battery.

The breaking detection circuit includes a rectifying and smoothing circuit for converting the amplified voltage from the amplifier into a DC voltage, a voltage comparator for comparing the DC voltage from the rectifying and smoothing circuit with a predetermined threshold voltage, and a logic voltage comprator into a logic signal of logic level "L" or "H" and outputting the logic signal to a measuring means, the measuring means judging the current path leading from the AC constant-current generator to the battery to be broken (in detective contact state) when the logic signal is in a predetermined level state.

Suitably, the resistance of a resistor for setting a measurement current, provided in the current path of the AC constant-current generator, can be switched to a plurality of ranges in predetermined magnification.

The voltage comparator in the breaking detection circuit includes an amplifier and serves as a hysteresis comparator, a DC voltage generated by the rectifying and smoothing circuit being applied to a minus input terminal of the amplifier, a reference voltage obtained through division of a supply voltage of the battery tester to a predetermined level and a voltage obtained through division of the output voltage of the amplifier to 1/n (n being a given division ratio) being applid to a plus input terminal of the amplifier, a threshold voltage at the plus input terminal being switched between two, i.e., high and low, voltages based on the presence or absence of output voltage of the amplifier.

A logic signal at a predetermined level, which is outputted from the breaking detection circuit to the measuring means in the event of breaking, is generated when the resistance of a current path for measurement including the internal resistance of the battery is higher than a value given by the following equation:

$$Rs=\{(\pi \cdot VH/2Vi)-1\} \times R12$$

wheere

Rs: the resistance of the current path including the internal resistance of the battery;

R12: the resistance of the resistor for setting the current for measurement in the AC constant-current generator;

VH: a high threshold voltage of the hysdteresis comparator; and

Vi: the voltage of the AC constant-voltage generator in the constant-current generator.

The above and further features and advantages of the invention will be more fully understood from the following description of the detailed embodiments when the same is read with reference to the accompanying drawings.

BRIEF DESCRIPTION OF THE DRAWINGS

FIG. 2 is a view showing the memory layout of a data memory used in the first embodiment;

FIG. 3 is a view for explaining the criteria of battery deterioration judgment in the first embodiment;

FIG. 4 is a view for explaining data stored in a control memory used in the first embodiment;

FIGS. 7(a) to 7(h) are waveform charts for explaining operation of various parts of the second embodiment;

FIGS. 9(a) and 9(d) to 9(h) are waveform charts for explaining, like FIGS. 7(a) to 7(h), operation of various parts of the second embodiment.

DESCRIPTION OF THE PREFERRED EMBODIMENTS

Figure 1:
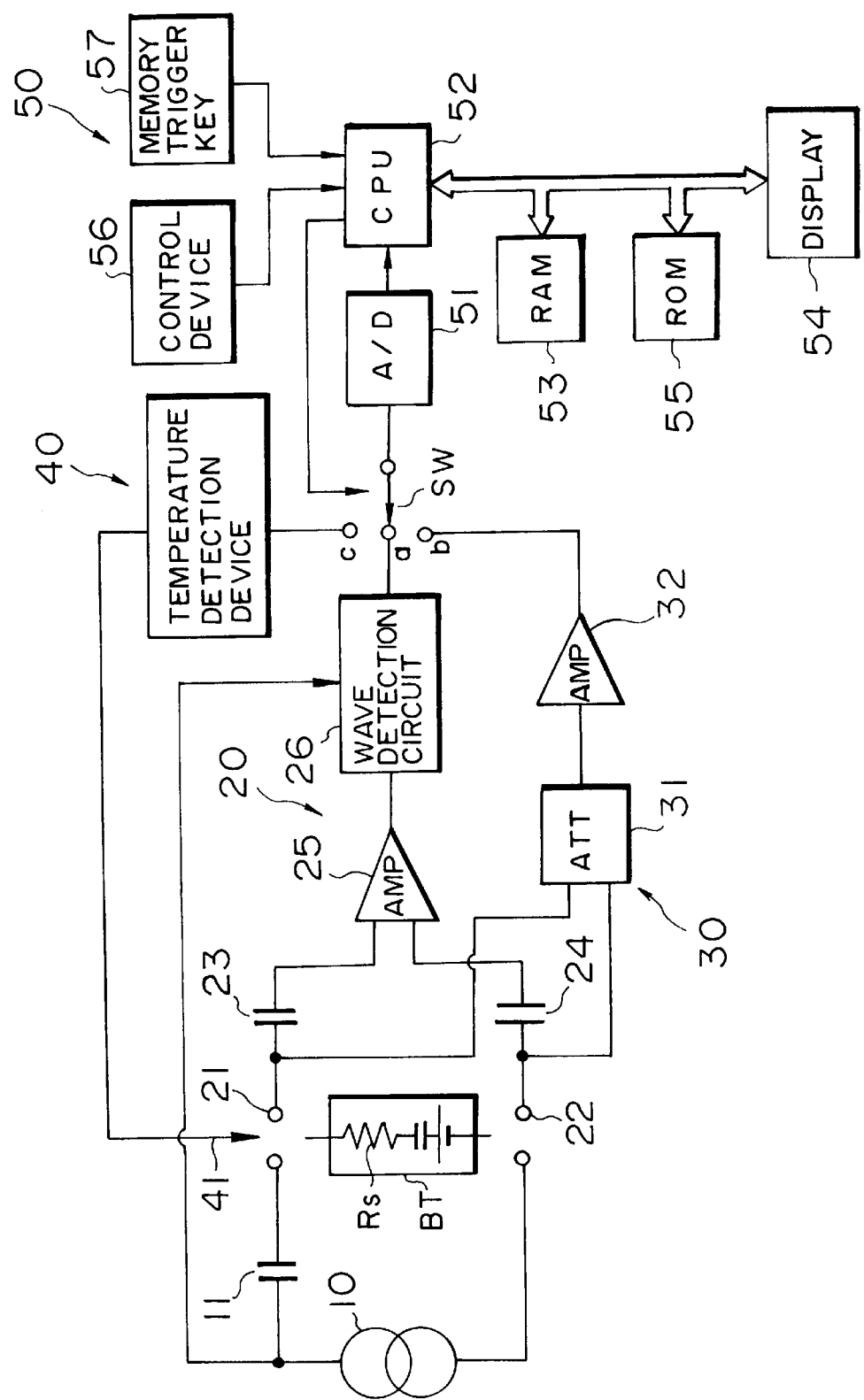
FIG. 1 is a block diagram showing a first embodiment of the battery tester according to the invention.

Referring to FIG. 1, a first embodiment of the battery tester according to the invention is shown, which comprises an AC constant-current generator 10 as a measurement signal source for applying an AC measurement signal across a battery BT under test, an internal resistance detecting device 20 for detecting the internal resistance of the battery BT, a voltage detecting device 30 for detecting the terminal voltage across the battery BT, a temperature detecting device 40 for detecting the terminal temperature of the battery BT, and a digital processing unit 50 for digitally processing detection signals from the detecting devices. The battery tester can test primary and secondary batteries, but in this embodiment a vehicle-mounted battery is assumed as the battery BT under test.

In this first embodiment, the AC constant-current generator 10 provides a very low supply voltage, of the order of several mV, and an AC signal is applied as a measurement signal across the battery BT from the AC constant-current generator 10 via a coupling capacitor 11.

The internal resistance detecting device 20 includes a pair of measuring electrodes 21 and 22 which are connected to the terminals of the battery BT, an amplifier 25 with the input side thereof connected to the measuring electrodes 21 and 22 via coupling capacitors 23 and 24, and a wave detection circuit 26 connected as the next stage to the amplifier 25. The wave detection circuit 26 is synchronized to the phase of the AC constant-current generator 10.

In the internal resistance detecting device 20, the voltage drop across the internal resistance (or equivalent series resistance) of the battery BT is amplified in the amplifier 25 in a predetermined manner and then detected in the wave detection circuit 26 in synchronism to the phase of the AC constant-current generator 10, whereby the sole effective resistance of the battery BT is detected.

The voltage detecting device 30 includes an attenuator for attenuating the terminal voltage obtained from the measuring electrodes 21 and 22 to a predetermined level (for instance to ⅒ or ¹⁄₁₀₀), and an amplifier 32 connected to the output side of the attenuator 31.

The temperature detecting device 40 includes a temperature sensor 41 which can be held in direct contact with a terminal of the battery BT. As will be described later, the temperature sensor 41 is assembled together with the Measuring electrodes 21 and 22 in the same probe. The digital processing unit 50 includes an A/D converter 51 and a CPU 52 connected as a control unit to the output side of the A/D convertr 51. On the input side of the A/D converter 51, a switch SW is provided, which selects either one of three contacts, i.e., a contact a connected to the wave detection circuit 26, a contact b connected to the voltage detecting device 30, and a contact c connected to the temperature device 40.

The switch SW is switched successively under control of the CPU 52, whereby the detection signals from the detecting devices 20, 30 and 40 are successively converted in the A/D converter 51 into digital data which are stored in a RAM 53 as a data memory.

FIG. 2 shows an example of the memory layout of the RAM 53. Areas 1, 2, . . . of the RAM 53 each has write locations for writing internal resistance data, terminal voltage data, temperature data and judgment result. As the switch SW is successively switched from contact a to contact b and thence to contact c in one test cycle, measurement data from the detecting devices 20, 30 and 40 are written in the respective locations and also displayed on a display 54.

Threshold data for the battery deterioration judgment are stored in a ROM 55 as a control memory. In the first embodiment, two threshold values α and β (α<β) are set as thresholds of the internal resistance, and one threshold value γ is set as a threshold of the terminal voltage. Whenever internal resistance data and terminal voltage data are taken in the RAM 53, the CPU 52 executes deterioration judgment by comparing the measurements of the internal resistance and terminal voltage to the corresponding threshold values.

Denoting the measured internal resistance by R and the measured terminal voltage by V, an example of the deterioration judgment will be described on the basis of a deterioration judgment table shown in FIG. 3.

① When $R \leq \alpha$ and $V > \gamma$, the judgment is "pass", and a display "PASS" indicating that the test result is "pass" is provided on the display 54.

② When $R \leq \alpha$ and $V \leq \beta$, or when $\alpha < R \leq \beta$ and $V > \gamma$, or when $\alpha < R \leq \beta$ and $V \leq \gamma$, the judgment is "warning", and a display "WARNING" is indicating that the test result is "warning" is provided on the display 54.

③ When $R > \beta$ and $V > \gamma$, or when $R > \beta$ and $V \leq \gamma$, the judgment is "fail", and a display "FAIL" indicating that the test result is "fail" is provided on the display 54.

When $R \leq \alpha$ and $V \leq \gamma$ in (2) above, two causes, i.e., short-circuit of a battery cell and over-discharge, are conceivable, and it is dangerous to provide an absolute judgment of "fail" in this case. For this reason, in this embodiment the display "WARNING" is provided in this case by flashing display so that it can be distinguished from the other warning cases when $\alpha < R \leq \beta$ and $V > \gamma$ and when $\alpha < R \leq \beta$ and $V \leq \gamma$ and re-test is provoked.

By way of example, when the voltage of the battery BT is not sufficienty increased by charging, a judgment is given that short-circuit of a battery cell is the cause. When the battery voltage is sufficiently increased, a judgment is given that over-discharge is the cause.

As for the temperature of the battery BT, no particular threshold is provided. However, when the terminal temperature is increased outstandingly, a judgment that the battery has a trouble may be given. It has been known from various experiments that a correlation between the temperature and the internal resistance exists. Thus, by providing temperature data the reliability of the judgment can be further improved.

In the first embodiment, two threshold values $\alpha$ and $\beta$ of the internal resistance and one threshold value $\gamma$ of the terminal voltage of the battery are set. This is only an example, and it is possible to set threshold values as desired.

The battery BT under test is not of a fixed kind, and the battery tester is adapted to test batteries of different ratings, for instance different rated voltages from 1.2 to 12 V or above. Accordingly, threshold value data (about the internal resistance, terminal voltage, etc.) and range information about suitable ranges used for measurement, are written in advance for various batteries BT to be tested in thee ROM 55 of the battery tester. The supply voltage of the analog measuring unit, i.e., the AC-constant-current generator 10 in this embodiment, the amplification degree of the resistance detecting device 20, the attenuation of the attenuator 31 in the voltage detecting device 30, etc. are automatically updated with updating of threshold data in the operating unit 50 such as a keyboard.

As the range information, for example, three different values of 0:300 m Ω, 1:30 Ω and 2:30 Ω are prepared, and suitable range information is set for each of the threshold data. Thus, by updating threshold data in the operating unit 56, a corresponding analog measuring system range is automatically set.

Figure 5:
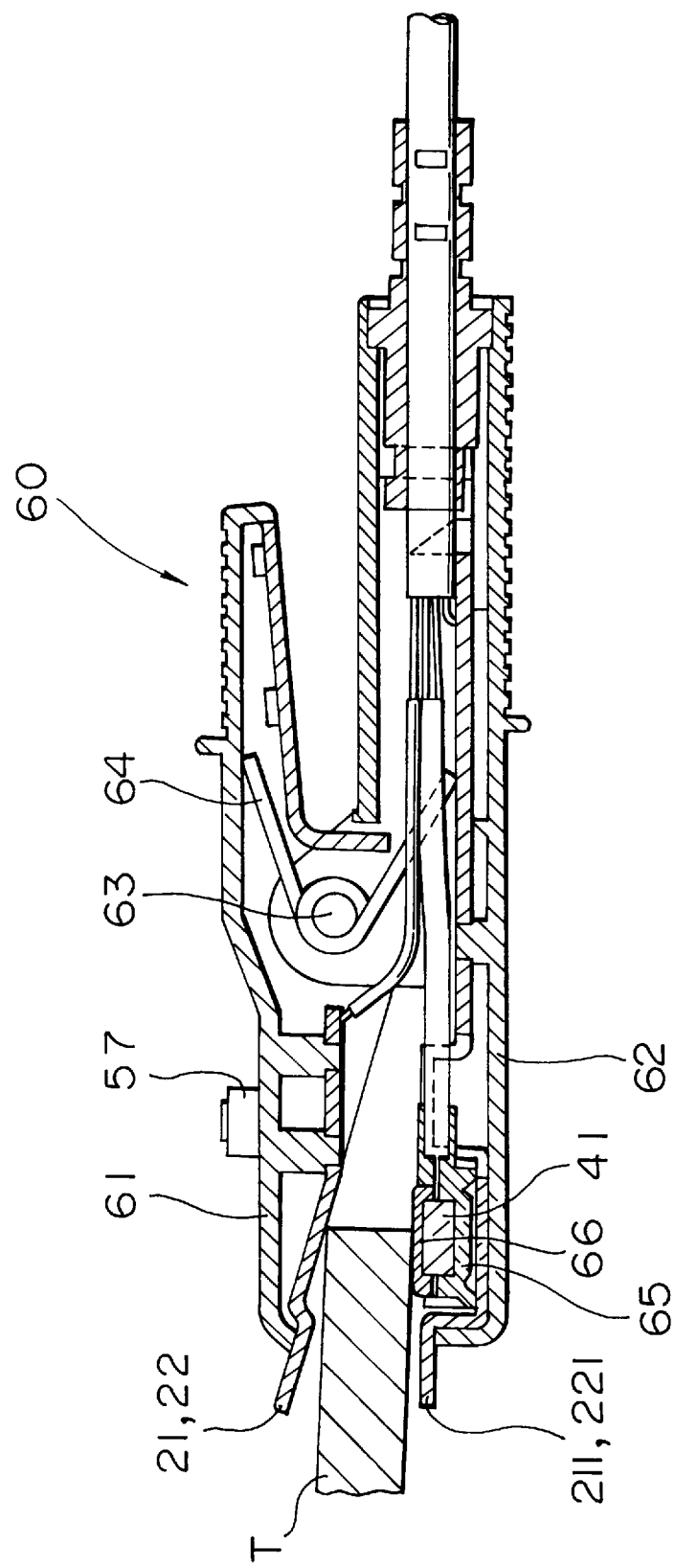
FIG. 5 is a sectional view showing a probe used in the first embodiment.

The first embodiment of the battery tester has a probe 60 as shown in FIG. 5. Actually, a pair or probes 60- is used, but here a probe with a temperature sensor 41 will be described. The other probe has the same construction except for that it does not include any temperature sensor.

This probe 60 has a pair of probe arms 61 and 62, which are coupled together by a coupling shaft 63 such that they can be opened and closed relative to each other. These probe arms 61 and 62 are biased in the closing direction by a spring 64 mounted on the coupling shaft 63. They have measuring electrodes 21 (22) and 211 (221) at their free ends. The measuring electrode 211 (221) is the source side electrode. The measuring electrodes 212 and 221 consist of adequately elastic metal pieces. In FIG. 5, a terminal T of a battery BT is shown in a clamped state.

In the first embodiment, the probe arm 62 has a temperature sensor 41, which is mounted such that it can be in contact with the battery terminal T. The temperature sensor 41 is mounted on the probe arm 62 via an elastic member 65 such as a rubber member. This means that the temperature sensor 41 can be in contact with the terminal in a broader area. The temperature sensor 41 has a temperature sensing surface, which is covered by a protective cover 66 made of a metal.

With this probe 60, by clamping the terminal T of the battery BT with the measuring electrodes 21 and 211 of the probe arms 61 and 62, the temperature sensor 41 is held in contact with the battery terminal T. Temperature measurement thus can be obtained simultaneously with the measurements of the internal resistance and the terminal voltage of the battery BT, and it is possible to dispense with the conventional time-consuming employment of a separate temperature sensor.

In the battery tester shown in FIG. 1, the digital processing unit 50 includes a memory trigger key 57 for instructing the CPU 52 to take measurement data in the RAM 53. However, in the case where internal resistance data or the like is taken by holding the probes in contact with each of a number of juxtapoxed batteris as in a UPS (uninterruptible power supply), for instance, it is cumbersome to depress the memory trigger key 57 by separating the hand from the probe.

According to the invention, the memory trigger key 57 is provided in the probe 60, permitting measurement data to be taken in the RAM 53 in each measuring operation without separating the hand form the probe 60. The memory trigger key 57 may be provided in only one of the probes 60. Suitably, it is provided at a position that it can be readily depressed with a finger.

Whenever the memory trigger key 57 is depressed, one piece of data (in this embodiment data of the internal resistance, terminal voltage and temperature) is taken in the RAM 53. The memory trigger key 57 is switchable to one data piece erase mode from one data piece store mode by the operating unit 56.

When the one data piece erase mode is set, data in the RAM 53 is erased one data piece after another form the newest data side every time the memory trigger key 57 is depressed. When only a measurement start instruction is provided without the above mode designation from the operating unit 56, the CPU switches the switch SW successively from contact a to contact b and thence to contact c for the writing of successive data in the RAM 53, while displaying the measurement data and result of deterioration judgment on the display 54.

As shown above, with the first embodiment of the battery tester, the internal resistance and terminal voltage of the battery BT are taken in the data memory 53 through the switch SW and the A/D converter 51, and the CPU 52 effects judgment by comparing these stored values with the respective threshold values and displays the results on the display 54. It is thus possible to know the deteriorated state of the battery with a very simple operation.

In addition, denoting the threshold values of the internal resistance by $\alpha$ and $\beta$ ($\alpha < \beta$), the threshold value of the terminal voltage by γ, the measured internal resistance value by R, and the measured terminal voltage value by V, judgment is made to provide a result of "pass" in the case ① when R≦α and V>γ, a result "warning" in the case ② when R≦α and V≦γ or when α<R≦β and V>γ or when α<R≦β and V≦γ, and a result "fail" in the case ③ when R>β and V>γ or when R>β and V≦γ. It is thus possible to obtain more accurate judgment results.

In the warning result of judgment, the case when R≦α and V≦γ and the case when α<R≦β and V>γ or when α<R≦β and V≦γ are displayed on the display such that they can be distinguished from each other. It is thus possible to prevent erroneous judgment.

As a further advantage, the threshold data can be readily updated by a keying operation, for instance, in the operating unit 56 according to the rating or kind of the battery BT under test. Since the range of the analog measuring unit is updated with the threshold data updating, the operation control for the measurement can be greatly improved.

Since the terminal temperature of the battery BT is measured simultaneously with the measurements of the internal resistance and the terminal voltage, it is possible to dispense with the conventional cumbersome temperature measurement with a separately prepared temperature gauge.

Moreover, where internal resistance data or the like is taken in a memory by holding the probes in contact with each of a number of juxtaposed batteries as in the UPS (uninterruptible power supply), the data can be taken by depressing the memory trigger switch provided by hand, which is provided on the probe, without separating the hand therefrom.

A battery tester with a breaking circuit, as a second embodiment of the invention, will now described with reference to FIGS. 6 to 9.

Figure 6:
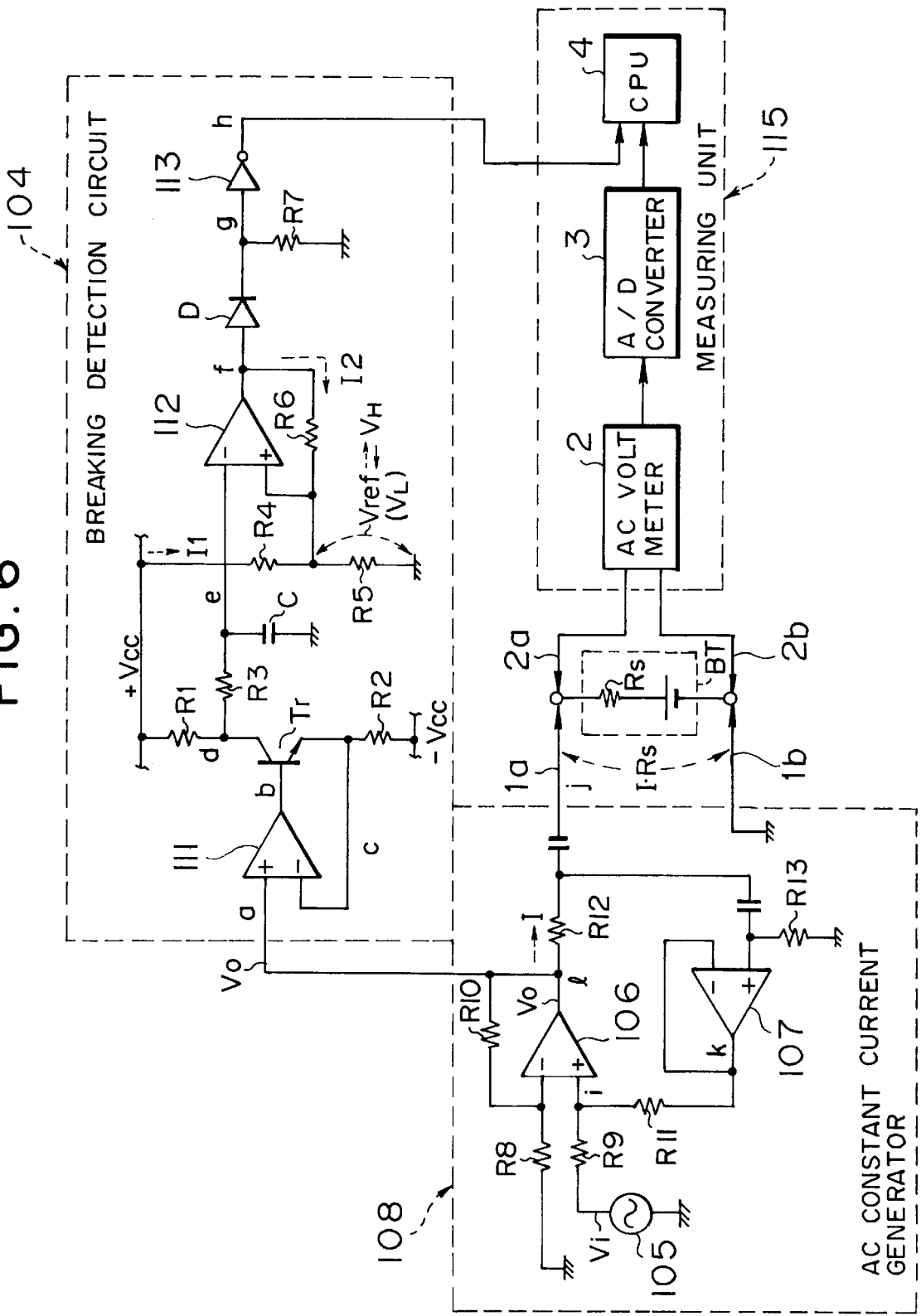
FIG. 6 is a circuit diagram, partly in block diagram, showing a second embodiment of the battery tester according to the invention.

As shown in FIG. 6, the illustrated battery tester comprises an AC constant-current source 108, a measuring unit 115 and also a breaking detection circuit 104.

The measuring unit 115 in this embodiment, like the prior art battery tester described before in connection with FIG. 10, includes an AC volt meter 2, an A/D converter 3, and a CPU 4. Alternatively, the measuring unit 115 may be constituted by the internal resistance detecting device 20, voltage detecting device 30 and digital processing unit 50 described before in connection with the first embodiment. In this case, the temperature detecting device 40 may be added, if necessary.

The AC constant-current source 108 includes two amplifiers 106 and 107 and resistors R8 and R13, and generates a constant AC sinusoidal current for measurement from an AC sinusoidal voltage at a constant level from, for instance, an AC constant voltage source 105. The AC current for measurement is coupled via source side probes 1a and 1b to a battery BT, and a voltage generated between the two terminals of the battery BT is coupled via sense side probes 2a and 2b to the AC volt meter 2. Thus, lie the prior art battery tester shown in FIG. 10, the internal resistance Rs of the battery BT is measured.

In this embodiment, although not shown, the source side and sense side probes 1a and 2a are commonly connected to a positive electrode side clamp probe of clip type, for instance, and the other source side and sense side probes 1b and 2b are commonly connected to a negative electrode side clamp probe of the same type. The positive electrode side and negative electrode side clamp probes are connected to the plus and minus terminals, respectively, of the battery BT.

Figure 10:
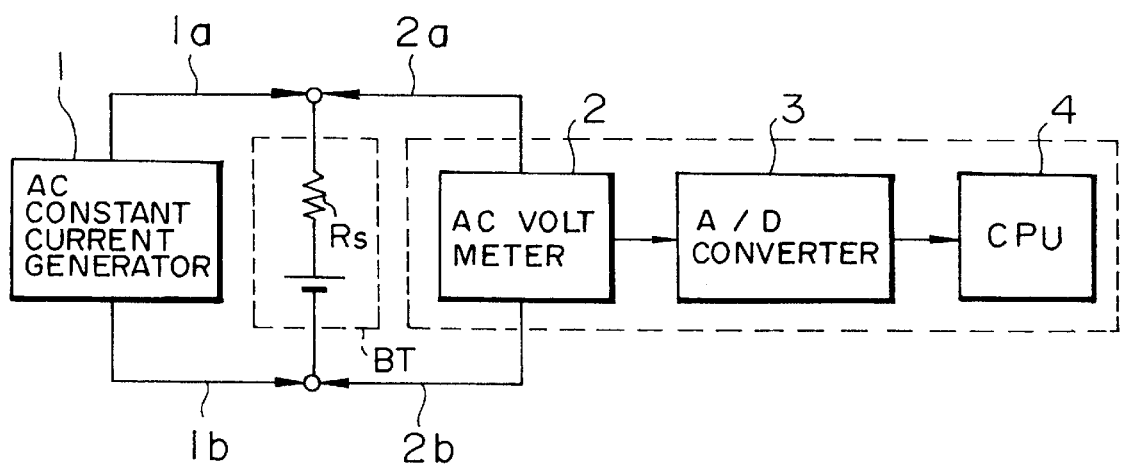
FIG. 10 is a block diagram showing the schematic electric construction of a prior art battery tester.

Instead of replacing the four probes 1a, 1b, 2a and 2b with the two clamp probes, the four probes may be used directly as respective terminals as shown in FIGS. 6 and 10. In this case, a resistor with a high resistance is connected between the probes 1a and 2a to prevent the open circuit therebetween.

In the case where the four resistors R to R11 have an equal resistance (i.e., R8=R9=R10=R11), the amplifier 106 serves as a non-inverting amplifier with an amplification degree of 2 with respect to its plus input terminal side. In this case, the voltage applied to the plus input terminal of the amplifier 106 is the sum of the output voltages of the AC constant voltage source 105 and the amplifier 107.

Where the plus input terminal side resistance R13 of the amplifier 107 is sufficiently higher than the resistance R12 of the output terminal side (1) of the amplifier 106 and the internal resistance Rs of the battery BT, AC constant current I from the amploifier 106 flows through the resistance R12 to the resistance Rs.

Thus, the terminal voltage generated across the battery BT, i.e., voltage I×Rs generated between the (j) side and ground, is applied without attenuation to the plus input terminal of the amplifier 107. In this case, the amplifier 107 is serving as a voltage-follower amplifier with an amplification degree of unity, which has a very high input impedance and zero output impedance, and a voltage I×Rs substantially equal to the input voltage on its output terminal (k) side.

Thus, assuming the (k) side to be at the ground potential, the component of the output voltage of the AC constant voltage source 105 that is applied to the plus input terinal (i) side of the amplifier 106 is $$Vi\{R11/(R9+R11)\}=Vi/2 \qquad \ldots (1)$$

The component of the output voltage of the amplifier 107 applied to the (i) side is, assuming the output impedance of the AC constant-voltage source 105 to be zero, $$I \cdot Rs\{R9/(R9+R11)\}=I \cdot Rs/2 \qquad \ldots (2)$$

The plus input terminal voltage of the amplifier 106, under the principle of superposition, is obtainable by adding together equations (1) and (2). That is, $$Vi/2+I \cdot Rs/2=(Vi+I \cdot Rs)/2$$

Since the amplifier 106 amplifiers ths input voltage with the amplification degree of 2, denoting the output voltage on the (i) side by Vo, $$Vo=Vi+I \cdot Rs \ldots \qquad (3)$$

The output voltage Vo also is $$Vo=I(R12+Rs) \ldots \qquad (4)$$

From this equation and equation (3), $$Vi+I \cdot Rs=I \cdot R123+I \cdot Rs$$

That is, $$Vi=I \cdot R12$$

Hence, $$I=Vi/R12 \ldots \qquad (5)$$

By substituting equation (5) into equation (4), the output voltage Vo of the amplifier 106 is $$Vo=Vi(R12+Rs)/R12 \ldots \qquad (6)$$

Since the voltage Vi generated from the AC constant voltage source 105 is constant from equation (5), the current I for measurement, which is caused through the battery BT, can be set to a desired value based on the resistance of the resistor R12.

Thus, in this battery tester, the resistance of the resistor R12 is switched in a plurality of ranges (not shown) form the consideration of the fact that the internal resistance Rs of the battery varies with the deterioration degree thereof.

When the maximum measurable level (i.e., rating) of the A/D converter 3 is exceeded by the terminal voltage I×Rs across the battery BT as a result of causing current I in a certain range to flow through the battery, all the bits of the digital data from the AID converter 3 are fixed to "1", that is, commonly called overflow of the A/D converter takes place. In this case, the current I for measurement is reduced by switching the range of the resistance R12 toward the higher resistance range side until no longer overflow is present.

In the event of defective contact of at least one of the probes 1a and 1b on the side of the AC constant-current generator 108 with the terminal or terminals of the battery BT, the current I for measurement does not flow through the battery BT, that is, breaking occurs. In this case, the open-circuit voltage of the AC constant-current generator 108 appears between the probes 1a and 1b. When this open-circuit voltage is coupled to the AC volt meter 2 via the probes 2a and 2b, overflow of the A/D converter 3 takes place as in the previous case. The open-circuit voltage is brought substantially up to the supply voltage to the battery tester, and no measurement current is caused in this case. Therefore, the overflow persists irrespective of the resistance range, in which the resistance of the resistor R12 is set. Besides, such a range setting operation is cumbersome. In this embodiment, the breaking detection circuit 104 monitors the output voltage of the AC constant-current generator 108, and automatically checks for breaking in the measurement current path.

In this embodiment, the breaking detection circuit 104 includes a full-wave rectifying part having an amplifier 111, a transistor Tr and resistors R1 and R2, a smoothing part having a resistor R3 and a capacitor C, a voltage comparing part having a comparator 112 and resistors R4 to R6, and a logic signal outputting part having a diode D, a resistor R7 and an inverter 113.

It is assumed that current I for measurement is normally flowing form the AC constant-current generator 108 through the probe 1a, the battery BT and the probe 1b and the voltage generated across the internal resistance Rs is coupled to the AC volt meter 2 via the probes 2a and 2b.

In this case, the output voltage Vo of the amplifier 106 in the AC constant-current generator 108 is also applied to the plus input terminal of the amplifier 111 in the breaking detection circuit 104. This input voltage is shown in FIG. 7(*a*). The operation of various parts of the breaking detection circuit 104 will now be described with reference to FIGS. 7(*a*) to 7(*h*) as well.

When the amplifier 111 and the transistor Tr are active, the amplifier 111 controls the transistor Tr by providing an output (see FIG. 7(*b*)) such that the emitter voltage of the transistor Tr (see FIG. 7(*c*)) is the same as the voltage Vo applied to its plus input terminal.

For example, when the voltage Vo applied to the plus input terminal of the amplifier 111 is negative during a period of 0 to $\pi$, the amplifier 111 initially controls the transistor Tr to reduce the emitter current therein by generating a negative voltage. The voltage drop across the resistor R2 is thus reduced, causing the emitter voltage of the transistor Tr to approach negative supply voltage −Vcc. Consequently, the voltage on the minus input terminal of the amplifier 111 is made the same as the negative voltage Vo applied to the plus input terminal.

When the voltage Vo applied to the plus input termminal of the amplifier 111 passes through the negative minimum level and turns to be increased toward the zero level, the amplifier 111 this time controls the transistor Tr to increase the emitter current therein.

During the period from 0 to $\pi$, the emitter current and collector current in the transistor Tr can be thought to be equal, by ignoring slight base current supplied form the amplifier 111 to the transistor Tr. With the emitter current reduction, the voltage drop across the resistor R1 is reduced to increase the collector voltage of the transistor Tr toward positive supply voltage +Vcc.

With the resistances of the resistors R1 and R2 set to be equal, the voltage drops across these resistors are equal, and a voltage (see FIG. 7(*d*)) which is the inversion of the emitter voltage (see FIG. 7(*c*)) appears on the collector of the transistor Tr.

In the next period from $\pi$ to 2 $\pi$, the positive half of the voltage Vo (see FIG. 7(*a*)) is applied to the plus input terminal of the amplifier 111. The amplifier 111 thus controls the transistor Tr to increase the emitter current therein by applying positive voltage (see FIG. 7(*b*)) to the base of the transistor Tr, thus increasing the voltage drop across the resistor R2 to make the voltage applied to its minus input terminal (see FIG. 7(*c*)) equal to the positive voltage Vo applied to the plus input terminal.

In this case, if the collector current in the transistor Tr is to be made equal to the emitter current, the voltage drop across the resistor R1 is increased, so that the collector voltage is reduced to be equal to the base voltage, which is being increased toward the positive side. Therefore, the collector current cannot be increased.

Rather, the collector voltage is substantially equal to the base voltage and increased toward the supply voltage +Vcc just like it is pushed up by the base voltage. Thus, the voltage drop across the resistor R1 is forcibly reduced, and the collector current is correspondingly reduced.

When the input voltage Vo to the amplifier 111 passes through the positive maximum level and turns to be reduced toward the zero level, the base voltage and the emitter voltage of the transistor Tr turn to be reduced to increase the potential difference between the collector voltage and the supply voltage +Vcc. The collector current thus turns to be reduced, and with increasing voltage drop across the resistor R1 the collector voltage is reduced towards the zero level while following the base voltage.

In the period from $\pi$ to 2 $\pi$, the collector voltage thus has substantially the same waveform as in the period form 0 to $\pi$ (see FIG. 7(D)). In the period from $\pi$ to 2 $\pi$, the emitter current is higher than the collector current, and a current corresponding to the difference is supplied from the amplifier 111 to the emitter side of the transistor Tr through the base.

In this embodiment the amplifier 111 and the transistor constitute a full-wave rectifier, but it is also possible to use a full-wave rectifier of absolute value detection type, which uses an amplifier and a diode. In the instant case, however, it is not sought to make absolute value measurement, so that the above full-wave rectifier is sufficient in performance.

The full-wave rectified voltage which is generated from the collector of transistor Tr, is subjected to pulsating component removal in a smoothing part with a low-pass filter, which has the resistor R3 and the capacitor C, and the resultant DC voltage is (see FIG. 7(e)) is applied to the comparator 112 in the voltage comparing part. Denoting the maximum amplitude of the AC voltage applied to the amplifier 111 by Vo, the DC voltage obtained as the result of the smoothing has a level of $(2/\pi)$Vo.

In the series circuit of the reistors R4 and R5 dividing the positive supply voltage +Vcc, the voltage on the side of the resistor R4 is supplied as reference voltage Vref to the plus input terminal of the comparator 112. Denoting current from the positive supply voltage +Vcc through the resistors R4 and R5 to the ground by I1, $$I1=Vcc/(R4+R5) \ldots \quad (7)$$

Since the reference voltage Vref is the voltage drop generated by this current through the resistor R5, $$Vref=I1 \cdot R5 \ldots \quad (8)$$

$$=Vcc \cdot R5/(R4+R5) \ldots (9)$$

Figure 8:
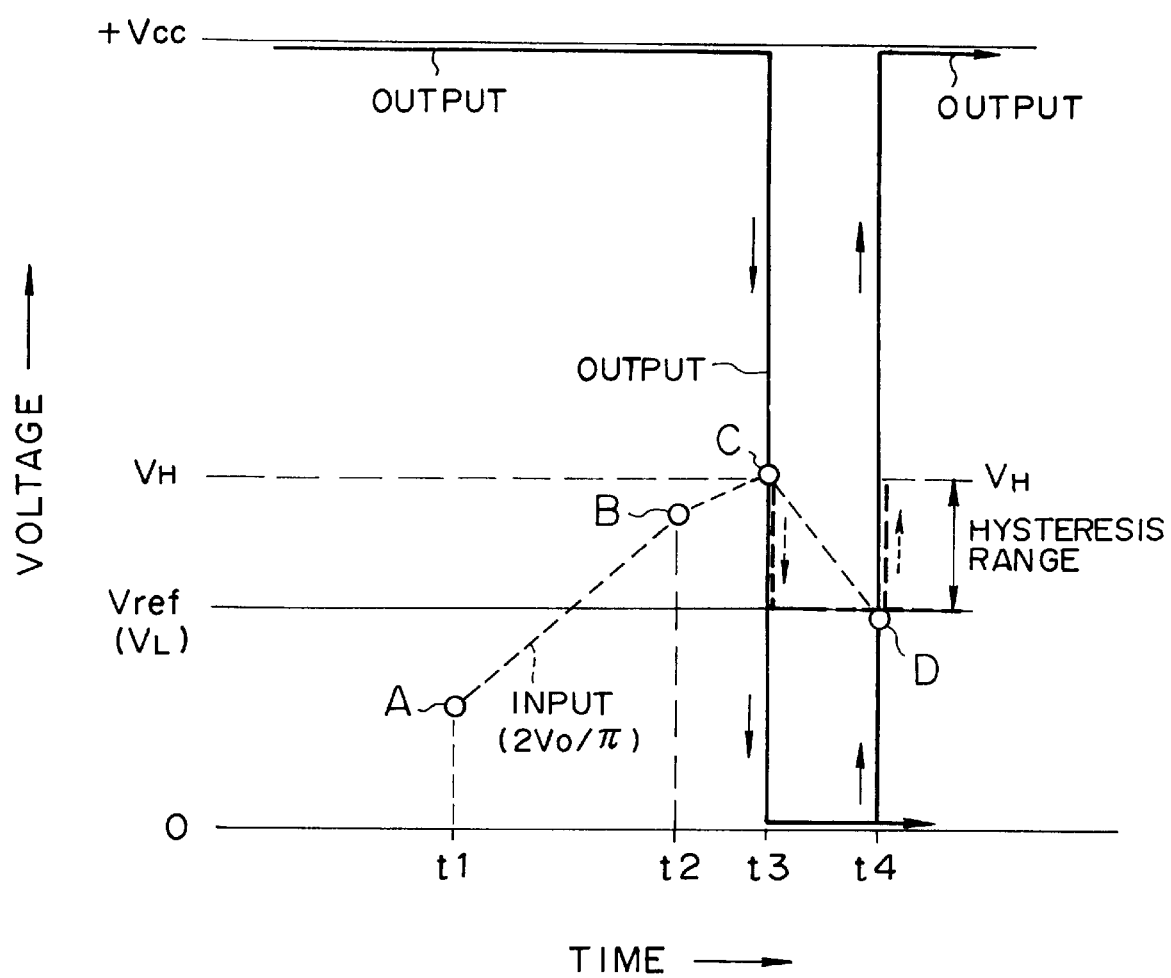
FIG. 8 is a waveform chart for explaining the operation a hysteresis comparator in the second embodiment.

This reference voltage Vref is shown as a solid plot in FIG. 8.

Referring to FIG. 8, assuming that before instant ti the minus input terminal of the comparator 112 has been at zero level without signal, a voltage substantially equal to the positive supply voltage +Vcc prevails at the output terminal of the comparator 112, causing current from the output terminal through resistors R6 and R5 to ground (see FIG. 7(f)). Denoting this current by I2, $$I2=Vcc/(R5+R6) \ldots \quad (10)$$

The two currents I1 and I2 join in the resistor R5.

Thus, denoting the voltage drop generated across the resistor R5 by the two joined currents by VH, $$VH=(I1+I2)R5 \ldots \quad (11)$$

By substituting equations (8) and (10) into the above equation, $$VH=Vref+Vcc \cdot R5/(R5+R6) \ldots \quad (12)$$

The second term in the right side of the above equation is a division voltage as a result of the division of the positive supply voltage +Vcc between the resistances R5 and R6, and the sum of this division voltage and the refrence voltage Vref is VH, which is shown by a broken plot in FIG. 8.

In this state, with application of a voltage of level A lower than the reference voltage Vref to the minus imput termminal of the comparator 112 at instant t1 or application of a voltage of level B higher than the reference voltage Vref at instant t2, the output voltage of the comparator 112 is not changed but remains substantially as +Vcc because the plus input terminal voltage is VH.

With application of a voltage at level C slightly higher than VH to the minus input terminal at instant t3, however, the output voltage of the comparator 112 falls from substantially +Vcc to substantially zero level. At this time, the output current I2 of the comparator 112 is reduced to zero, that is, the second term on the right side of equation (12) is reduced to zero, and the puls input terminal voltage is reduced from VH to the reference voltage Vref.

In this state, the output voltage level of the comparator 112 substantially remains zero irrespective of variations of the C level voltage applied to the minus input terminal of the comparator 112 due to noise or other causes unless the amplitude of variation toward the lower level side becomes lower than the voltage Vref at the plus input terminal. The reference voltage Vref at the plus input terminal in this case corresponds to a lower level side threshold voltage VL.

With application of a voltage at level D lower than the reference voltage Vref to the minus input terminal, the output voltage of the comparator 112 rises from substantially zero level to substantially +Vcc, and the plus input terminal voltage rises from Vref to VH.

In this state, like the above case, the output voltage of the comparator 112 substantially remains zero irrespective of variations of the D level voltage at the minus input terminal of the comparator 112 due to noise or like causes unless the amplitude of variation toward the higher level side surpasses the voltage VH at the plus input terminal. In this case, the plus input terminal voltage VH is a higher level side threshold voltage.

The comparator, in which the plus input terminal threshold voltage is switched to either VH or VL in response to a voltage applied to the minus input terminal as shown above, is called hysteresis comparator, and the level difference between VH and VL (or Vref) is called hysteresis width.

In the manner as shown above, the output voltage Vo of the amplifier 111 (equation (6)) is full-wave rectified and smoothed through the low-pass filter, and the resultant DC voltage $2Vo/\pi$ is compared with the plus input terminal threshold voltage VH in the comparator 112.

When the DC voltage $2Vo/\pi$ is below the thresholds voltage VH (see FIG. 7(e)), the output voltage of the comparator 112 is brought to substantially the positive supply voltage +Vcc (FIG. 7(f)). As a result, the diode D is turned on to cause current through the load resistor R7 and generate a voltage substantially equal to the supply voltage +Vcc across the resistor R7 (see FIG. 7(g)). The inverter 1123 receives this voltage and sends out a signal of Logic level "L" to the CPU 4.

When the logic signal from the breaking detection circuit 104 is "L" even though data from the A/D converter 3 is overflow data, the CPU 4 judges that the load battery BT is connected to the AC constant-current generator 108, and issues a command to a display (not shown) for displaying, for instance, the necessity of switching the resistance range of the resistor R12 to the higher resistance range side.

When the load battery BT is not connected to the AC constant-current generator 108, a sinusoidal wave voltage with peaks substantially equal to the positive and negative supply voltages (FIG. 9(a)), is applied form the amplifier 106 in the AC constant-current source 108 to the amplifier 11 in the breaking detection circuit 104. As a result, a full-wave rectified voltage with a peak substantially equal to +Vcc (FIG. 8(d)), appears on the collector side of the transistor Tr.

A positive DC voltage which is generated through the smoothing of the full-wave rectified voltage, which is substantially $2Vcc/\pi$, is applied to the minus input terminal of the comparator 112, and compared with the threshold voltage VH at the plus input terminal. Since the threshold voltage VH is set to a level lower than $2Vcc/\pi$, the output voltage of the comparator 112 is reduced to zero level at this time (see FIG. 9(f)), thus turning off the diode D and reducing the output voltage thereof to zero level (see FIG., 9(g)). The inverter 113 thus sends out a signal of logic level "L" (see FIG. 9(h)) to the CPU 4.

When data from the A/D comparator 3 is overflow data and also the logic signal from the breaking detection circuit 104 is "H" the CPU 4 does not judge that the load battery BT is connected to the AC constant-current generator 108, and shows the result of the judgment on a display (not shown).

The term "breaking" may mean actual breaking of the current path from the AC constant-current generator 108 to the battery BT and also increase of the internal resistance Rs of the battery due to such causes as defective contact of the probes 1a and 1b with the battery terminals and deterioration of the battery. These cases all may be considered to be increase of the internal resistance Rs of the battery BT to consider the rated measurable resistance.

The input voltage Vo of the breaking detection circuit 104 is, from equaton (6), $$Vo=Vi(R12+Rs)/R12$$

When the DC voltage $2Vo/\pi$ obained by full-wave rectifying and smoothing the input voltage Vo is equal to or lower than the threshold voltage VH, the internal resistance Rs is measurable. By setting, for instance, $$2Vo/\pi=VH$$

from equation (6)

$$2Vi(R12+Rs)/\pi R12=VH$$

From the above equation, $$R12+Rs=\pi VH\ R12/2Vi$$

Hence, $$Rs=\{(\pi \cdot VH/2Vi)-1\}R12 \ldots \quad (13)$$

In equation (13), Vi is the output voltage of the AC constant-current generator 108, VH is a voltage determined by the resistances of the resistors R4 to R6 dividing the positive supply voltage +Vcc, and R12 is the resistance for setting the measurement current I, and these values are all known. Since the value in the parentheses should be positive, $$\pi \cdot VH/2Vi>1$$

Rs in equation (13) is the rated measurable resistance. When the resistance is below this value, the level of the logic signal sent out from the breaking detection circuit 104 is "L", indicating that the internal resistance Rs is measurable in the measuring unit 115. The resistance of the resistor R12 is switched to a plurality of ranges in certain magnifications. The same magnifications are applied to variations of the rated measurable resistance of Rs, permitting resistance measurement in a wide range.

As shown above, in this embodiment, when overflow of the A/D converter 3 in the measurinrg unit 115 is caused by an excessive voltage under measurement, the CPU 4 can automatically determine whether the current path leading from the AC constant-current generator 108 to the battery BT under test is open-cicuited or broken (i.e., load-free) based on whether the level of the logic signal from the breaking dewtection circuit 104 is "L" or "H". The embodiment is thus a battery tester which can be conveniently handled by the user.

In addition, since the resistance for setting the measurement current can be switched to a plurality of ranges in predetermined magnifications, the same magnifications apply to variations of the rated measurable resistance, thus permitting resistance measurement in a wide range.

The same functions and effects as in the second embodiment are obtainable in the case where the measuring unit 115, like the first embodiment, is constituted by the internal resistance detecting device 20, the voltage detecting device 30 and the digital processing unit 50.

What is claimed is:

1. A battery tester comprising:
   an AC constant-current generator for applying an AC current for measurement to a battery under test,
   internal resistance detecting means having wave detection means connected to the AC constant-current generator and being adapted to be disposed between terminals of the battery, said internal resistance detecting means detecting a voltage proportional to an internal resistance of said battery in synchronism to a phase of the AC current when said AC current is applied thereto,
   voltage detecting means adapted to be connected to the battery for detecting a DC terminal voltage of said battery, and
   deterioration judging means connected to the internal resistance detecting means and said voltage detecting means, said deterioration judging means judging deterioration of said battery from said internal resistance detected by said internal resistance detecting means and said DC terminal voltage detected by said voltage detecting means.

2. The battery tester according to claim 1, wherein said deterioration judging means includes an AID converter for converting the detection signals obtained from said internal resistance detecting means and said voltage detecting means into digital data, a data memory for storing said digital data, a control memory, in which threshold resistance data and threshold voltage data for judging the deterioration of said battery are stored, and control means for writing a measured value of said internal resistance of said battery and a measured value of said DC terminal voltage in said memory and judging the deterioration of said battery by comparing said measured internal resistance value with said threshold resistance data and comparing said measured DC terminal voltage value with said threshold voltage data.

3. The battery tester according to claim 2, which further comprises a switch for alternately switching said internal resistance detecting means and said voltage detecting means, thereby providing said detection signals from said internal resistance detecting means and said voltage detecting means to said A/D converter.

4. The battery tester according to claim 2, which further comprises a temperature detecting means for directly detecting the temperature of a terminal of said battery.

5. The battery tester according to claim 4, wherein said temperature detecting means is selectively switchable together with said internal resistance detecting means and said voltage detecting means by a switch, whereby battery terminal temperature data from said temperature detecting means is stored in said data memory in relation to resistance and voltage data of said battery.

6. The battery tester according to claim 4, which further comprises a probe having a pair of openable and closable probe arms for clamping terminals of said battery, each of said probe arms having an end provided with a measuring electrode commonly used for said internal resistance detecting means and said voltage detecting means, said temperature detecting means being assembled in either one of said probe arms to be able to contact with the terminal of said battery.

7. The battery tester according to claim 6, wherein said temperature detecting means is mounted on said probe arm via an elastic member.

8. The battery tester according to claim 6, wherein said probe includes a memory trigger switch for providing, to said control means, an instruction for taking measurement data in said data memory, said control means causing the measurement data at an instant of issuing of said instruction from said memory trigger switch to be taken in said data memory.

9. The battery tester according to claim 1, wherein said internal resistance detecting means further includes an amplifier connected to the terminals of the battery for amplifying a voltage drop across the terminals, said wave detection means being connected to the amplifier.

10. A battery tester comprising:

an AC constant-current generator for applying an AC current for measurement to a battery under test, internal resistance detecting means adapted to be connected to the battery for detecting an internal resistance of said battery according to an AC voltage signal generated from said battery when said AC current is applied thereto, voltage detecting means adapted to be connected to the battery for detecting a DC terminal voltage of said battery, and deterioration judging means connected to the internal resistance detecting means and said voltage detecting means, said deterioration judging means judging deterioration of said battery from said internal resistance detected by said internal resistance detecting means and said DC terminal voltage detected by said voltage detecting means, said deterioration judging means including an A/D converter for converting detection signals obtained from said internal resistance detecting means and said voltage detecting means into digital data; a data memory for storing said digital data; a control memory, in which threshold resistance data and threshold voltage data for judging the deterioration of said battery are stored; and control means for writing a measured value of said internal resistance of said battery and a measured value of said DC terminal voltage in said data memory and judging the deterioration of said battery by comparing said measured internal resistance value with said threshold resistance data and comparing said measured DC terminal voltage value with said threshold voltage data, wherein denoting threshold values of said internal resistance by $\alpha$ and $\beta$ ($\alpha<\beta$), a threshold value of said terminal voltage by $\gamma$, said measured internal resistance value by R, and said measured terminal voltage value by V, said control means judges:

(1) "pass" when $R \leq \alpha$ and $V > \gamma$;

(2) "warning" when $R \leq \alpha$ and $V \leq \gamma$ or when $\alpha < R \leq \beta$ and $V > \gamma$ or when $\alpha < R \leq \beta$ and $V \leq \gamma$; and (3) "fail" when $R > \beta$ and $V > \gamma$ or when $R > \beta$ and $V \leq \gamma$.

11. The battery tester according to claim 10, wherein when "warning" in (2) is judged, the case when $R \leq \alpha$ and $V \leq \gamma$ and the case when $\alpha < R \leq \beta$ and $V > \gamma$ or when $\alpha < R \leq \beta$ and $V \leq \gamma$ are displayed such that said cases are distinguishable from each other.

12. A battery tester comprising:

an AC constant-current generator for applying an AC current for measurement to a battery under test, internal resistance detecting means adapted to be connected to the battery for detecting an internal resistance of said battery according to an AC voltage signal generated from said battery when said AC current is applied thereto, voltage detecting means adapted to be connected to the battery for detecting a DC terminal voltage of said battery, deterioration judging means connected to the internal resistance detecting means and said voltage detecting means, said deterioration judging means judging deterioration of said battery from said internal resistance detected by said internal resistance detecting means and said DC terminal voltage detected by said voltage detecting means, said deterioration judging means including an A/D converter for converting detection signals obtained from said internal resistance detecting means and said voltage detecting means into digital data; a data memory for storing said digital data; a control memory, in which threshold resistance data and threshold voltage data for judging the deterioration of said battery are stored; and control means for writing a measured value of said internal resistance of said battery and a measured value of said DC terminal voltage in said data memory and judging the deterioration of said battery by comparing said measured internal resistance value with said threshold resistance data and comparing said measured DC terminal voltage value with said threshold voltage data, and operating means connected to the control means for providing various instruction signals to the control means, range setting information with respect to analog measurement means including the internal resistance detecting means and the voltage detecting means being written for each threshold data in the control memory, a range of the analog measurement means being switched whenever said threshold data is updated by the operating means.

13. A battery tester comprising:

internal resistance measuring means for measuring an internal resistance of a battery under test including an AC constant-current generator for providing an AC current for measurement to the battery; AC voltage detecting means adapted to be connected to the battery for detecting an AC voltage generated between terminals of the battery; converting means attached to the AC voltage detecting means for converting detected AC voltage into a resistance value; an amplifier connected to the AC constant-current generator for amplifying an AC voltage from the AC constant-current generator to a constant level; and a resistor provided in a current path leading from an output side of the amplifier to the battery for setting the AC current for measurement to a predetermined level, a breaking detection circuit for comparing an output voltage from said AC constant-current generator with a predetermined reference voltage, and checking whether the current path between said AC constant-current generator and said battery is open or closed based on whether said reference voltage is exceeded, said breaking detection circuit including a rectifying and smoothing circuit for converting the amplified voltage from said amplifier into a DC voltage; a voltage comparator connected to the rectifying and smoothing circuit for comparing said DC voltage from said rectifying and smoothing circuit with a predetermined threshold voltage; and a logic signal generator connected to the voltage comparator for converting an output of said voltage comparator into a logic signal of logic level "L" or "HH" and outputting said logic signal, and measuring means connected to the logic signal generator for receiving the logic signal, said measuring means judging if the current path leading from said AC constant-current generator to said battery is broken or not when said logic signal is in a predetermined level state.

14. The battery tester according to claim 13, wherein resistance of the resistor for setting the measurement current, provided in the current path of said AC constant-current generator, can be switched to a plurality of ranges in predetermined magnifications.

15. The battery tester according to claim 13, wherein said voltage comparator in said breaking detection circuit includes an amplifier and serves as a hysteresis comparator, the DC voltage generated by said rectifying and smoothing circuit being applied to a minus input terminal of said amplifier, a reference voltage obtained through division of a supply voltage of said battery tester to a predetermined level and a voltage obtained through division of the output voltage of said amplifier to 1/n (n being a given division ratio) being applied to a plus input terminal of said amplifier, a threshold voltage at said plus input terminal being switched between two, voltages based on a presence or absence of output voltage of said amplifier.

16. The battery tester according to claim 13, wherein the logic signal at a predetermined level, outputted from said breaking detection circuit to said measuring means in the event of breaking, is generated when the resistance of a current path for measurement including the internal resistance of said battery is higher than a value given by the following equation:

$$Rs = \{(\pi \cdot VH/2Vi) - 1\} \times R12$$

where

Rs: resistance of the current path including the internal resistance of the battery;

R12: resistance of the resistor for setting the current for measurement in the AC constant-current generator;

VH: a high threshold voltage of said hyesteresis comparator; and

Vi: the voltage of the AC constant-voltage generator in said constant-current generator.

* * * * *